(12) United States Patent
Seo et al.

(10) Patent No.: US 9,989,856 B2
(45) Date of Patent: Jun. 5, 2018

(54) METHOD OF MANUFACTURING SEMICONDUCTOR DEVICES

(71) Applicant: Samsung Electronics Co., Ltd., Suwon-si (KR)

(72) Inventors: Jung-Woo Seo, Hwaseong-si (KR); Sang-Jin Kim, Suwon-si (KR); Jong-Seo Hong, Yongin-si (KR); Jong-Hoon Nah, Suwon-si (KR); Choon-Ho Song, Suwon-si (KR)

(73) Assignee: SAMSUNG ELECTRONICS CO., LTD., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 119 days.

(21) Appl. No.: 15/080,706

(22) Filed: Mar. 25, 2016

(65) Prior Publication Data

US 2016/0293728 A1  Oct. 6, 2016

(30) Foreign Application Priority Data

Mar. 31, 2015  (KR) .................. 10-2015-0044755

(51) Int. Cl.
| | |
|---|---|
| *G03F 7/20* | (2006.01) |
| *H01L 29/66* | (2006.01) |
| *H01L 21/033* | (2006.01) |
| *H01L 21/311* | (2006.01) |
| *H01L 21/3213* | (2006.01) |

(52) U.S. Cl.
CPC .......... *G03F 7/2022* (2013.01); *G03F 7/2002* (2013.01); *H01L 21/0334* (2013.01); *H01L 21/31144* (2013.01); *H01L 21/32139* (2013.01); *H01L 29/66545* (2013.01); *H01L 29/66795* (2013.01)

(58) Field of Classification Search
CPC ....................................................... G03F 7/00
See application file for complete search history.

(56) References Cited

U.S. PATENT DOCUMENTS

| | | |
|---|---|---|
| 4,318,010 A | 3/1982 | Hurley, III et al. |
| 5,514,906 A | 5/1996 | Love et al. |
| 5,920,977 A | 7/1999 | Wyckoff et al. |
| 6,203,635 B1 | 3/2001 | Sellars |
| 7,396,484 B2 | 7/2008 | Daskal et al. |
| 7,506,428 B2 | 3/2009 | Bedell et al. |
| 7,565,732 B2 | 7/2009 | Le et al. |
| 7,915,170 B2 | 3/2011 | Ruo Qing et al. |
| 8,039,400 B2 | 10/2011 | Koschinsky et al. |

(Continued)

*Primary Examiner* — Kathleen Duda

(74) *Attorney, Agent, or Firm* — Muir Patent Law, PLLC

(57) ABSTRACT

Disclosed is a method of manufacturing semiconductor devices. A dummy gate structure is formed on a pattern area defined by an edge area of a substrate. An interlayer insulating layer pattern is formed to cover the pattern area and exposing the edge area of the substrate. A blocking pattern is formed on the interlayer insulating layer pattern such that the edge area of the substrate is covered with the blocking pattern and the pattern area of the substrate is exposed through the blocking pattern. A gate hole in the pattern area of the substrate in correspondence to the dummy gate structure, and a metal gate structure is formed in the gate hole. Accordingly, the edge area of the substrate is protected in the etching process and the deposition process of the replacement gate metal (RGM) process.

20 Claims, 15 Drawing Sheets

(56) References Cited

U.S. PATENT DOCUMENTS

| | | | |
|---|---|---|---|
| 8,184,399 B2 | 5/2012 | Wu et al. | |
| 8,318,607 B2 | 11/2012 | Rathsack et al. | |
| 8,420,470 B2 | 4/2013 | Choi | |
| 8,501,283 B2 | 8/2013 | Shin et al. | |
| 8,658,483 B2 | 2/2014 | Hsu et al. | |
| 8,835,237 B2 | 9/2014 | Jagannathan et al. | |
| 8,846,302 B2 | 9/2014 | Liu et al. | |
| 8,859,398 B2 | 10/2014 | Letz et al. | |
| 2002/0064964 A1* | 5/2002 | Jang | H01L 21/28079 438/740 |
| 2013/0228920 A1 | 9/2013 | Chiou et al. | |
| 2014/0131814 A1 | 5/2014 | Shen et al. | |
| 2014/0206161 A1 | 7/2014 | Perng et al. | |
| 2016/0049489 A1* | 2/2016 | Wan | H01L 29/42392 257/347 |

\* cited by examiner

US 9,989,856 B2

METHOD OF MANUFACTURING SEMICONDUCTOR DEVICES

CROSS-REFERENCE TO RELATED APPLICATIONS

This application claims priority under 35 U.S.C § 119 to Korean Patent Application No. 10-2015-0044755, filed on Mar. 31, 2015, in the Korean Intellectual Property Office, the disclosure of which is incorporated by reference herein in its entirety.

BACKGROUND

1. Technical Field

Example embodiments relate to a method of manufacturing semiconductor devices, and more particularly, to a method of manufacturing semiconductor devices having metal gate electrodes.

2. Description of the Related Art

According to a conventional process for forming the metal gate electrode of semiconductor devices, a dummy gate structure is formed on a substrate and an interlayer insulating layer is formed on the substrate to cover the dummy gate structure. Then, the interlayer insulating layer may be partially removed from the substrate by a planarization process in such a way that only the dummy gate structure is exposed. Thereafter, the dummy gate structure may be replaced with conductive metal by a replacement metal gate (RMG) process, to thereby form the metal gate electrode of the semiconductor device.

The interlayer insulating layer is formed on a whole surface of the substrate including an edge area as well as a pattern area of the substrate, and the interlayer insulating layer at the edge area of the substrate still remains while the dummy gate structure is removed by the RMG process at the pattern area of the substrate. Therefore, the edge area of the substrate is protected from an etching of the RMG process at the pattern area by the interlayer insulating layer. For example, the edge area is protected from the etching process while removing the dummy gate structure from the pattern area in the RMG process.

However, there has been found that the interlayer insulating layer may be partially removed from the edge area of the substrate in the planarization process. In such a case, the edge area of the substrate may also be etched off in the RMG process, and an edge trench may be formed together with the removal of the dummy gate structure at the pattern area.

When conductive materials is filled up into the edge trench in a following metal gate process and a wiring process, the conductive bulk in the edge trench functions as a defect source of the semiconductor device.

SUMMARY

Example embodiments provide methods of manufacturing semiconductor devices in which an additional protection layer may be provided at the edge area of the substrate and the edge area may be prevented from being etched in the RMG process.

According to example embodiments, there is provided a method of manufacturing semiconductor devices. A substrate including a pattern area and an edge area may be provided. A plurality of first structures may be formed on the pattern area defined by the edge area. The first structures may be separated from one another by an interlayer insulating layer pattern on the pattern area. Then, a blocking pattern may be formed on the interlayer insulating layer pattern to cover the edge area of the substrate and to expose the pattern area. Then, the first structures may be replaced with second structures.

In example embodiments, the pattern area may include at least an active fin structure that may be an active region protruded from a surface of the substrate and defined by a device isolation layer. The first structures may be arranged on the active fin.

In example embodiments, the first structures may be replaced with the second structures as follows: The first structures may be removed from the substrate by an etching process having an etching selectivity with respect to the blocking pattern and the interlayer insulating layer pattern, thereby forming a plurality of openings that may be defined by the interlayer insulating layer pattern and an upper surface of the substrate may be exposed. Then, a preliminary second structure may be formed on the blocking pattern and the interlayer insulating layer pattern to fill the openings. The preliminary second structure may be planarized by a planarization process in such a way that the preliminary second structure may just remain in the openings.

In example embodiments, the blocking pattern may be removed from the substrate together with the preliminary second structure such that the edge area of the substrate may be exposed when the second structure may be formed on the substrate.

According to example embodiments, there is provided another method of manufacturing semiconductor devices. A substrate including a pattern area and an edge area may be provided. A dummy gate structure may be formed on the pattern area defined by the edge area. An interlayer insulating layer may be formed on the pattern area. An interlayer insulating layer pattern may be formed by recessing the interlayer insulating layer to expose an upper surface of the dummy gate and to partially expose the edge area. Then, a blocking pattern may be formed on the interlayer insulating layer pattern to cover the edge area of the substrate and to expose the pattern area of the substrate. Then, a gate hole may be formed in the pattern area of the substrate in correspondence to the dummy gate structure, and a metal gate structure may be formed in the gate hole.

In example embodiments, the blocking pattern may be formed as follows. A blocking layer may be formed on a whole surface of the substrate such that the dummy gate structure, the interlayer insulating layer pattern and the edge area of the substrate may be covered with the blocking layer. A mask pattern may be formed on the blocking layer. The mask pattern may expose the pattern area and cover the edge area. Then, the blocking layer may be partially removed from the pattern area of the substrate.

In example embodiments, the mask pattern may be formed as follows. A negative type photoresist layer may be formed on the blocking layer and a wafer edge exposure (WEE) process may be performed to the photoresist layer, thereby exposing the photoresist layer on the edge area to a light. The photoresist layer may be developed to remove the photoresist layer in the pattern area while remaining the photoresist layer in the edge area. The photoresist pattern may be formed as the mask pattern in such a configuration that the blocking layer in the pattern area may be exposed through the photoresist pattern and the blocking layer in the edge area may be covered with the photoresist pattern.

In example embodiments, after forming the photoresist layer, an edge bead removal (EBR) process may be further performed to the substrate, thereby removing residuals of the photoresist layer from at least one of a rear surface and a side surface of the substrate.

In example embodiments, the EBR process may include at least one of a back rinsing process in which a cleaning solution is injected to the rear surface of the substrate and a bevel rinsing in which a cleaning solution is injected to a bevel area of the substrate.

In example embodiments, the blocking layer may be removed by a dry etching process using the mask pattern as an etching mask.

In example embodiments, a surface portion of the dummy gate structure may be over etched by the dry etching process for removing the blocking patter.

In example embodiments, the blocking layer may include silicon oxide and the dummy gate structure includes polysilicon such that the blocking layer may be removed from the pattern area by a first dry etching process and the dummy gate structure may be removed from the pattern area by a second dry etching process that may be performed consecutively to the first dry etching process.

In example embodiments, the dummy gate structure may be formed as follows. A capping layer may be formed on the pattern area of the substrate, and a dummy gate pattern may be formed into a plurality of dummy gate lines on the capping layer. The dummy gate lines may linearly extend in a direction and may be spaced apart by a uniform gap distance. A gate spacer may be formed on each side portion of the dummy gate line.

In example embodiments, the interlayer insulating layer pattern may be formed as follows. An interlayer insulating layer may be formed on the substrate to a sufficient thickness to cover the dummy gate structure such that the pattern area and the edge area of the substrate may be covered with the interlayer insulating layer. Then, the interlayer insulating layer may be partially removed from the substrate such that the interlayer insulating layer remains in a gap space between the neighboring gate spacers and the dummy gate structures and the edge area of the substrate are exposed.

In example embodiments, the gate hole may be formed by a wet etching process in which the gate spacer, the interlayer insulating layer pattern and the blocking pattern may have a higher etching rate than the dummy gate pattern.

In example embodiments, the dummy gate pattern may include polysilicon and may be removed from the substrate by a first wet etching process for removing a native oxide layer from the dummy gate pattern and a second wet etching process for removing the polysilicon.

In example embodiments, the first wet etching process may use aqueous hydrogen fluoride (HF) solution as an etchant and the second wet etching process may use aqueous ammonia solution as an etchant.

In example embodiments, the metal gate structure may be formed in the gate hole as follows. A gate insulation layer may be on a bottom and sidewall of the gate hole and on top surfaces of the blocking pattern and the interlayer insulating layer pattern. A gate metal layer may be formed on the gate insulation layer to a sufficient thickness to fill the gate hole, and the gate metal layer and the gate insulation layer may be planarized by a planarization process in such a way that the gate insulation layer and the gate metal layer may just remain in the gate hole and the edge area of the substrate may be exposed.

In example embodiments, the gate insulation layer may include a high-k material and the gate metal layer includes one of tungsten (W) and aluminum (Al).

According to example embodiments, there is provided still another method of manufacturing semiconductor devices. A plurality of polysilicon lines and a plurality of gate spacers may be formed on both sides of the polysilicon lines on at least a fin type active region in a pattern area defined by an edge area of a substrate, and an interlayer insulating layer pattern may be formed to fill a gap space between the gate spacers. Then, a blocking pattern may be formed on the interlayer insulating layer pattern such that the edge area of the substrate may be covered with the blocking pattern and the pattern area of the substrate may be exposed through the blocking pattern. The polysilicon lines may be removed from the substrate by an etching process using the blocking pattern and the interlayer insulating layer pattern as an etching mask, thereby forming a gate hole in the pattern area that is defined by a pair of the gate spacers. A high-k material layer may be formed on a bottom and sidewall of the gate hole and on top surfaces of the blocking pattern and the interlayer insulating layer pattern, and a tungsten layer may be formed on the high-k material layer to a sufficient thickness to fill the gate hole. The tungsten layer and the high-k layer may be planarized until the tungsten layer and the high-k layer may remain only in the gate holes and the edge area of the substrate may be exposed.

According to example embodiments, the blocking layer may be formed on a whole surface along the surface profile of the dummy gate line on the pattern area of the substrate and be formed into the blocking pattern through which the pattern area of the substrate is exposed and with which the edge area of the substrate is covered. Therefore, the edge area of the substrate may be sufficiently protected from the etching process for removing the dummy gate line from the pattern area and the deposition process for forming the metal gate structure, and no damage may be caused to the edge area of the substrate in the etching process and the deposition process.

Particularly, the edge trench may be sufficiently prevented at the edge area of the substrate, and as a result, there is no possibility that the conductive materials of the gate metal layer may be deposited into the edge trench in forming the metal gate structure, thereby preventing the defect sourced at the edge area of the substrate.

In addition, since the negative type photoresist pattern may be used as a mask pattern for forming the blocking pattern, the conventional wafer edge exposure (WEE) apparatus may be used without any modifications when forming the mask pattern for the blocking pattern. Particularly, the edge bead removal (EBR) process may be performed just merely at the bevel area of the substrate except the substrate surface of the edge area in the conventional WEE process, so that the edge area may be still covered with the mask pattern.

Accordingly, the edge area of the substrate may be sufficiently protected from the replacement gate metal (RGM) process by the blocking pattern and no damage such as the edge trench may be caused to the edge area of the substrate, thereby preventing the defect source such as the conductive bulk at the edge area of the substrate.

BRIEF DESCRIPTION OF THE DRAWINGS

These and other features will become more apparent by describing in detail example embodiments thereof with reference to the accompanying drawings of which.

DETAILED DESCRIPTION OF THE EMBODIMENTS

Figure 1:
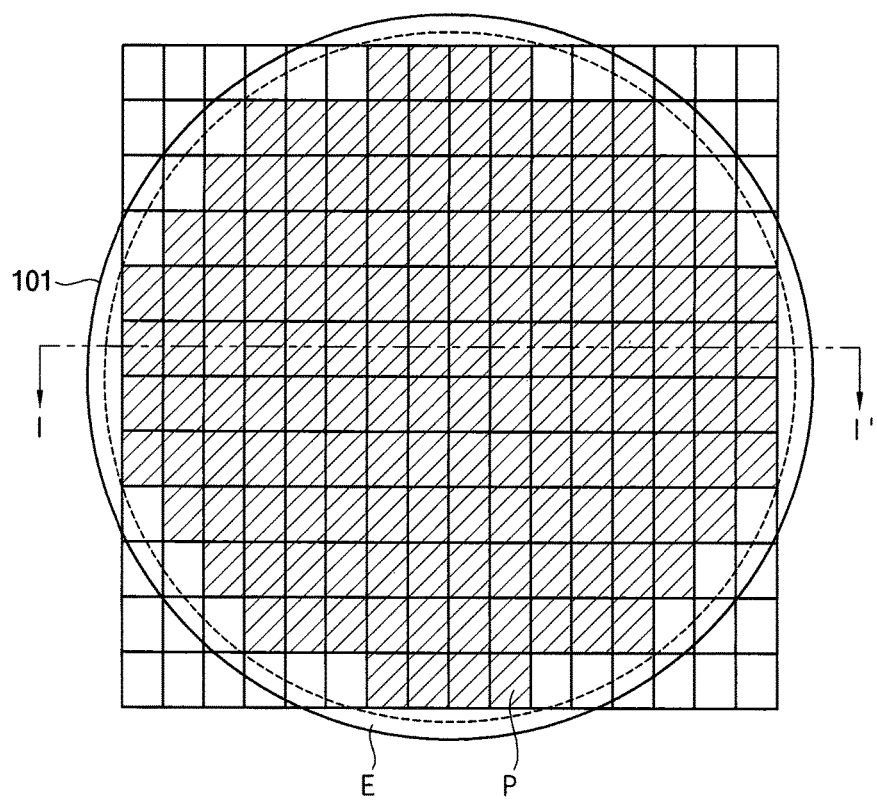
FIG. 1 is a view illustrating a layout of a substrate for methods of manufacturing semiconductor devices in accordance with an example embodiment.

Example embodiments will now be described more fully with reference to the accompanying drawings. The disclosed features, however, may be embodied in many different forms and should not be construed as being limited to the embodiments set forth herein. In the drawings, the size and relative sizes (e.g., thicknesses, etc.) of layers and regions may be exaggerated for clarity. Like numbers refer to like elements throughout. Though the different figures show variations of example embodiments, these figures are not necessarily intended to be mutually exclusive from each other. Rather, as will be seen from the context of the detailed description below, certain features depicted and described in different figures can be combined with other features from other figures to result in various embodiments, when taking the figures and their description as a whole.

It will be understood that when an element is referred to as being "on," "connected to," "electrically connected to," or "coupled to" to another component, it may be directly on, connected to, electrically connected to, or coupled to the other component or intervening components may be present. In contrast, when a component is referred to as being "directly on," "directly connected to," "directly electrically connected to," "directly coupled to" or as "contacting" another component, there are no intervening components present. As used herein, the term "and/or" includes any and all combinations of one or more of the associated listed items.

It will be understood that although the terms first, second, third, etc. may be used herein to describe various elements, components, regions, layers, and/or sections, these elements, components, regions, layers, and/or sections should not be limited by these terms. Unless the context indicates otherwise, these terms are only used to distinguish one element, component, region, layer, and/or section from another element, component, region, layer, and/or section. For example, a first element, component, region, layer, and/or section could be termed a second element, component, region, layer, and/or section without departing from the teachings of example embodiments.

Spatially relative terms, such as "beneath," "below," "lower," "above," "upper," and the like may be used herein for ease of description to describe the relationship of one component and/or feature to another component and/or feature, or other component(s) and/or feature(s), as illustrated in the drawings. It will be understood that the spatially relative terms are intended to encompass different orientations of the device in use or operation in addition to the orientation depicted in the figures.

The terminology used herein is for the purpose of describing particular example embodiments only and is not intended to be limiting of example embodiments. As used herein, the singular forms "a," "an," and "the" are intended to include the plural forms as well, unless the context clearly indicates otherwise. It will be further understood that the terms "comprises," "comprising," "includes," and/or "including," when used in this specification, specify the presence of stated features, integers, steps, operations, elements, and/or components, but do not preclude the presence or addition of one or more other features, integers, steps, operations, elements, components, and/or groups thereof.

Example embodiments may be described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will typically have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature, their shapes are not intended to illustrate the actual shape of a region of a device, and their shapes are not intended to limit the scope of the example embodiments.

Terms such as "same," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to reflect this meaning.

As used herein, items described as being "electrically connected" are configured such that an electrical signal can be passed from one item to the other. Therefore, a passive electrically conductive component (e.g., a wire, pad, internal electrical line, etc.) physically connected to a passive electrically insulative component (e.g., a prepreg layer of a printed circuit board, an electrically insulative adhesive connecting two device, an electrically insulative underfill or mold layer, etc.) is not electrically connected to that component. Moreover, items that are "directly electrically connected," to each other are electrically connected through one or more passive elements, such as, for example, wires, pads, internal electrical lines, through vias, etc. As such, directly electrically connected components do not include components electrically connected through active elements, such as transistors or diodes.

As used herein, a semiconductor device may refer to any of the various devices, and may also refer, for example, to devices such as a semiconductor chip (e.g., memory chip and/or logic chip formed on a die), a stack of semiconductor chips, a semiconductor package including one or more semiconductor chips stacked on a package substrate, or a package-on-package device including a plurality of packages. These devices may be formed using ball grid arrays, wire bonding, through substrate vias, or other electrical connection elements, and may include memory devices such as volatile or non-volatile memory devices.

An electronic device, as used herein, may refer to these semiconductor devices, but may additionally include products that include these devices, such as a memory module, memory card, hard drive including additional components, or a mobile phone, laptop, tablet, desktop, camera, or other consumer electronic device, etc.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and should not be interpreted in an idealized or overly formal sense unless expressly so defined herein.

Reference will now be made to example embodiments, which are illustrated in the accompanying drawings, wherein like reference numerals may refer to like components throughout.

FIG. 1 is a view illustrating a layout of a substrate for methods of manufacturing semiconductor devices in accordance with an example embodiment.

Referring to FIG. 1, a semiconductor substrate 101 for manufacturing semiconductor devices may include a pattern area P and an edge area E around the pattern area P. A plurality of semiconductor chips may be formed on the pattern area of the substrate 101 and the substrate 101 may be cut into pieces by a chip, thereby manufacturing the semiconductor devices.

For example, the semiconductor substrate 101 may include a silicon (Si) substrate, a germanium (Ge) substrate, a silicon germanium (SiGe) substrate, a silicon-on-insulator (SOI) substrate and a germanium-on-insulator (GOI) substrate. Although not shown in figures, the substrate 101 may include a well in which p-type or n-type dopants may be distributed.

Particularly, the substrate 101 may include a silicon wafer having a circular contour. When a plurality of square chips are arranged on the circular wafer, some of the peripheral area of the circular wafer may not be utilized for the square chip due to geometrical limitations. For instance, the substrate 101 may include a pattern area P, an effective area of the wafer on which the square chips may be arranged, and an edge area E, an ineffective area of the wafer on which the square chips may not be arranged.

In the present example embodiment, the substrate 101 may include a semiconductor wafer having a diameter of about 300 mm and the edge area E may have a thickness of about 3 mm to about 5 mm. While the present example embodiment discloses that the pattern area P and the edge area E of the substrate is defined based on a wafer, any other substrates may also include the pattern area and edge area as long as the effective area and the ineffective area for the chips are discriminated on the substrate in view of the geometrical shape of the chip and the substrate.

Since the manufacturing process for the semiconductor devices may be performed on a whole surface of the substrate 101, the edge area E of the substrate 101 may undergo the same manufacturing process as the pattern area P. When a metal gate structure is formed on the pattern area of the conventional substrate by a replacement metal gate (RMG) process, an edge trench tends to generate at the edge portion and conductive materials are likely to be filled up in the edge trench in the following process, which may function as a defect source of the semiconductor device.

Figure 8:
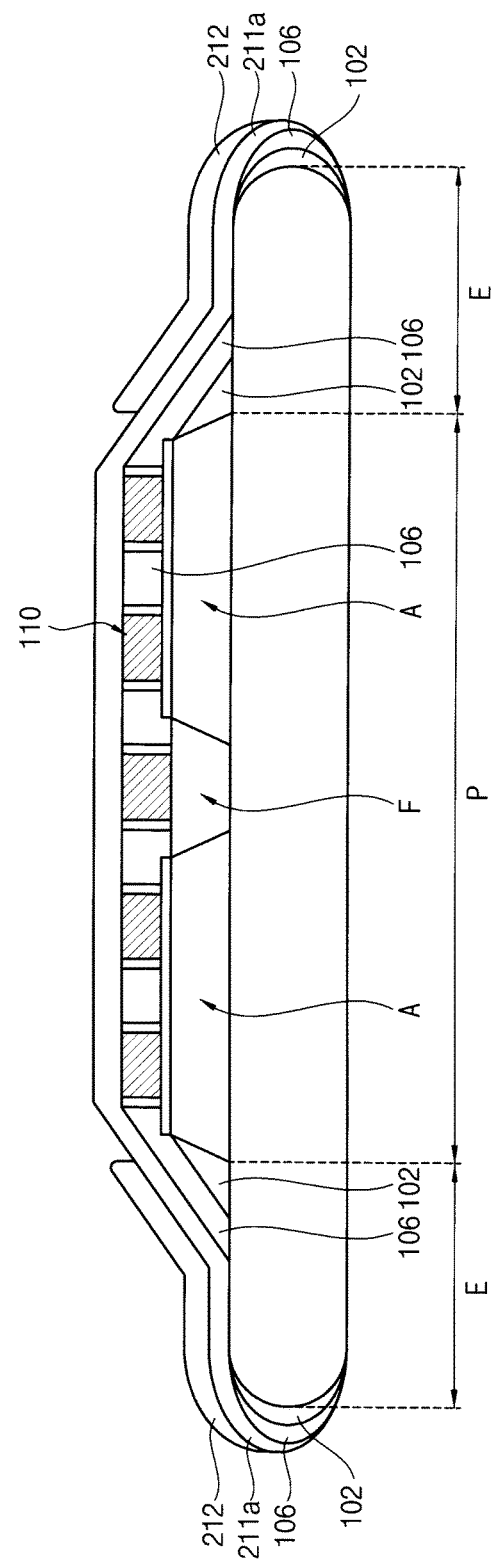

However, a blocking pattern 211 in FIG. 8 may be formed on the edge portion of the substrate 101, so the defect source in the edge trench may be sufficiently prevented under the same RMG process for forming the metal gate in example embodiments.

FIGS. 2 to 14 are cross-sectional views illustrating processing steps for a method of manufacturing semiconductor devices in accordance with example embodiments. FIGS. 2 to 14 are cross-sectional views cut along a line I-I' of FIG. 1.

A dummy gate structure 110 may be formed on the pattern area P of the substrate 101 through example processes as described with reference to FIGS. 2 and 3. The dummy gate structure 110 in which a dummy gate line 107 may be stacked on a capping pattern 103.

Figure 2:
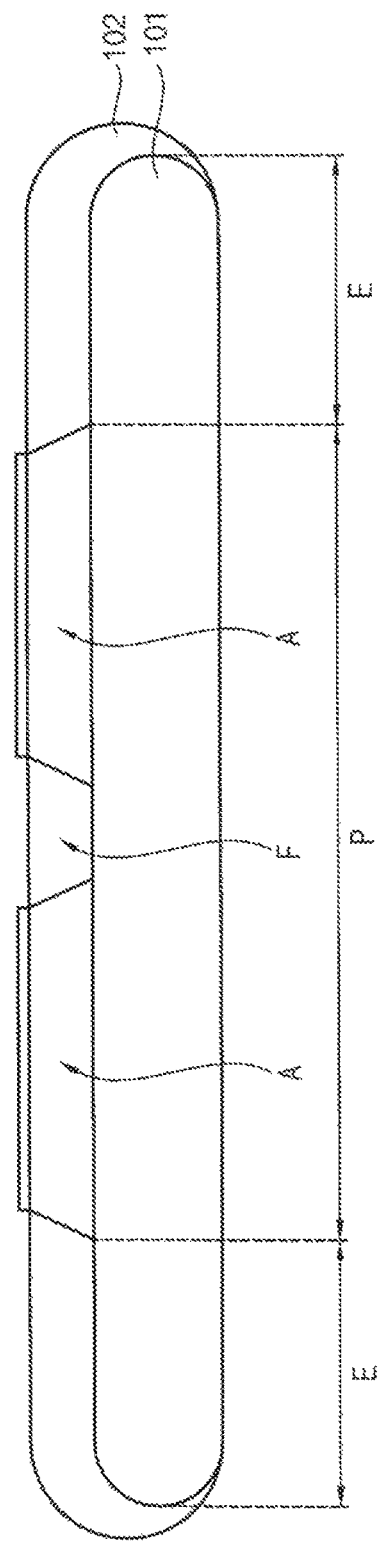
FIGS. 2 to 14 are cross-sectional views illustrating processing steps for a method of manufacturing semiconductor devices in accordance with example embodiments.

Referring to FIG. 2, the capping layer 103 may be formed on an active region A of the substrate 101 defined by a device isolation layer 102.

A device isolation trench (not shown) may be formed on a field region F of the substrate 101 by a device isolation process such as a shallow trench isolation (STI) process and insulation materials such as silicon nitride (SiN) may be filled into the device isolation trench, thereby forming the device isolation layer 102 around the active region A.

Particularly, the device isolation layer 102 may be formed in such a structure that a top surface may be lower than a top surface of the active region A so the active region A may be protruded from the substrate 100 like a fin. For example, the active region A may be formed into a fin structure that may be called an active fin structure. The metal gate structure, which will be described in detail hereinafter, may be formed on the active fin structure so as to form a fin field effect transistor (finFET).

The capping layer 103 may be formed on the active region A by a thermal oxidation process or a deposition process. For example, the capping layer 103 may include a silicon oxide layer or a silicon nitride layer.

The capping layer 103 may have an etching rate sufficiently lower than that of the dummy gate line 104 and thus may be sufficiently resistive to a subsequent etching process for removing the dummy gate line 104. For example, the capping layer 103 may function as an etch stop layer of the etching process. Therefore, the substrate 101 may be sufficiently protected from the etching process for removing the dummy gate line 104.

While the present example embodiment discloses that the capping layer 103 is formed posterior to the device isolation layer 102, the capping layer 103 would be formed prior to the device isolation layer 102 according to the requirements of the manufacturing process. For example, the capping layer 103 may be formed on the substrate 101 and the device isolation trench may be formed on the substrate 101 together with the capping layer 103 and then the device isolation layer 102 may be formed in the device isolation trench.

The edge area E of the substrate 101 may be partially removed in the device isolation process. The device isolation trench may also be formed at the edge area E and the edge area E may be covered with the device isolation layer 102. Therefore, the device isolation layer 102 may extend to a side surface of the substrate 101 from the edge area E and the side surface may be covered with the device isolation layer 102.

Figure 3:
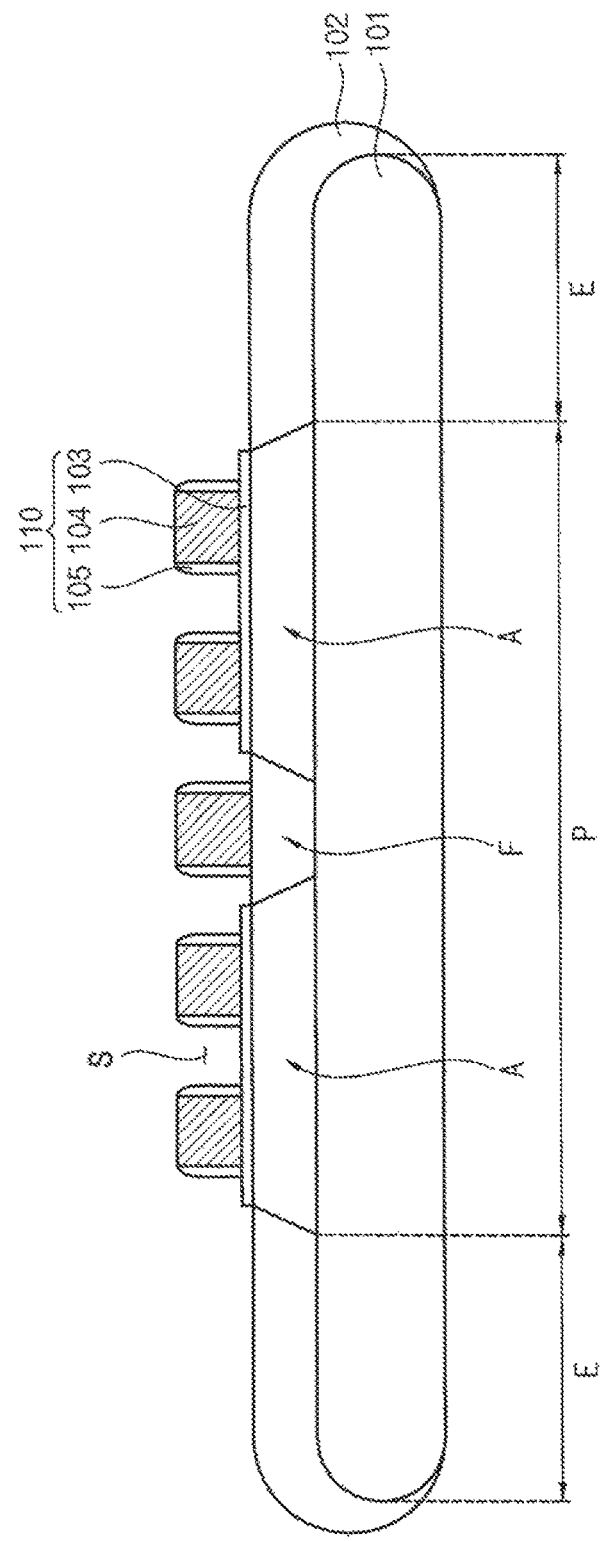

Referring to FIG. 3, a plurality of the dummy gate lines 104 may be formed on the capping layer 103 in such a configuration that the dummy gate lines 104 may linearly extend in a direction and be spaced apart by the same gap distance and a gap space S may be provided between neighboring dummy gate lines 104. The device isolation layer 102 and the capping layer 103 may be exposed through the gap space S.

For example, a dummy gate layer (not shown) may be formed on the substrate 101 and may be patterned into the dummy gate line 104 by a photolithography process. The dummy gate line 104 may make contact with a gate area of the active region A, so that the metal gate electrode of the semiconductor device may be formed just by replacing the dummy gate line 104 with conductive metals in a subsequent process.

In the present example embodiment, the dummy gate layer may comprise polysilicon and may be formed by a deposition process such as, for example, chemical vapor deposition (CVD) process, physical vapor deposition (PVD) process, or atomic layer deposition (ALD) process.

A gate spacer 105 may be formed on a sidewall of the dummy gate line 104. For example, spacer layer (not shown) may be formed on the substrate 101 to a sufficient thickness to cover the dummy gate line 104 and may be partially removed from the substrate 101 by an anisotropic etching process. For instance, the spacer layer may remain just on the sidewall of the dummy gate line 104, thereby forming the gate spacer 105 on the sidewall of the dummy gate line 104. The gate spacer 105 may comprise silicon nitride or silicon oxynitride.

Therefore, the dummy gate line 104 and the gate spacer 105 on the capping layer 103 may be formed into the dummy gate structure 110 on the substrate 101.

Figure 4:
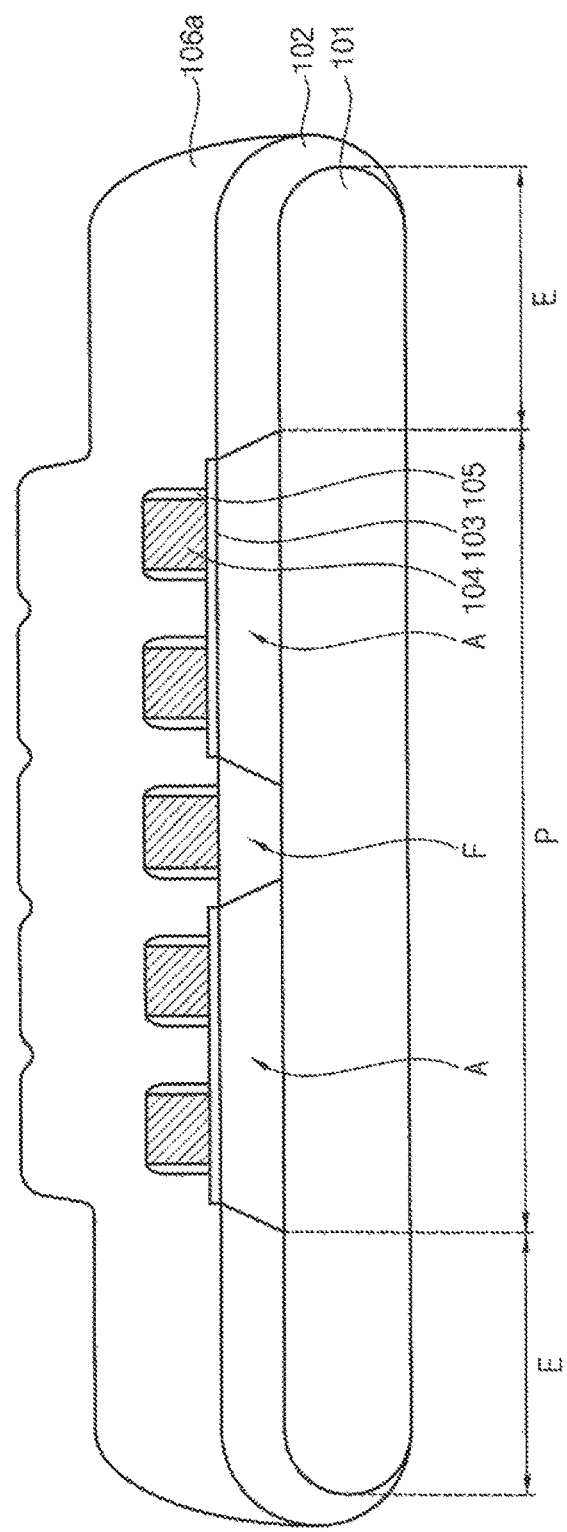

Referring to FIG. 4, an interlayer insulating layer 106a may be formed on the substrate 101 to a sufficient thickness to fill up the gap space S, so the dummy gate structures 110 and the pattern area P and the edge area E of the substrate 101 may be covered with the interlayer insulating layer 106a.

For example, the interlayer insulating layer 106a may comprise an oxide having good gap-fill characteristics such as boron phosphorus silicate glass (BPSG), so the gap space S may be uniformly filled up with the interlayer insulating layer 106a even though the dummy gate line 104 may be have a high aspect ratio.

Figure 5:
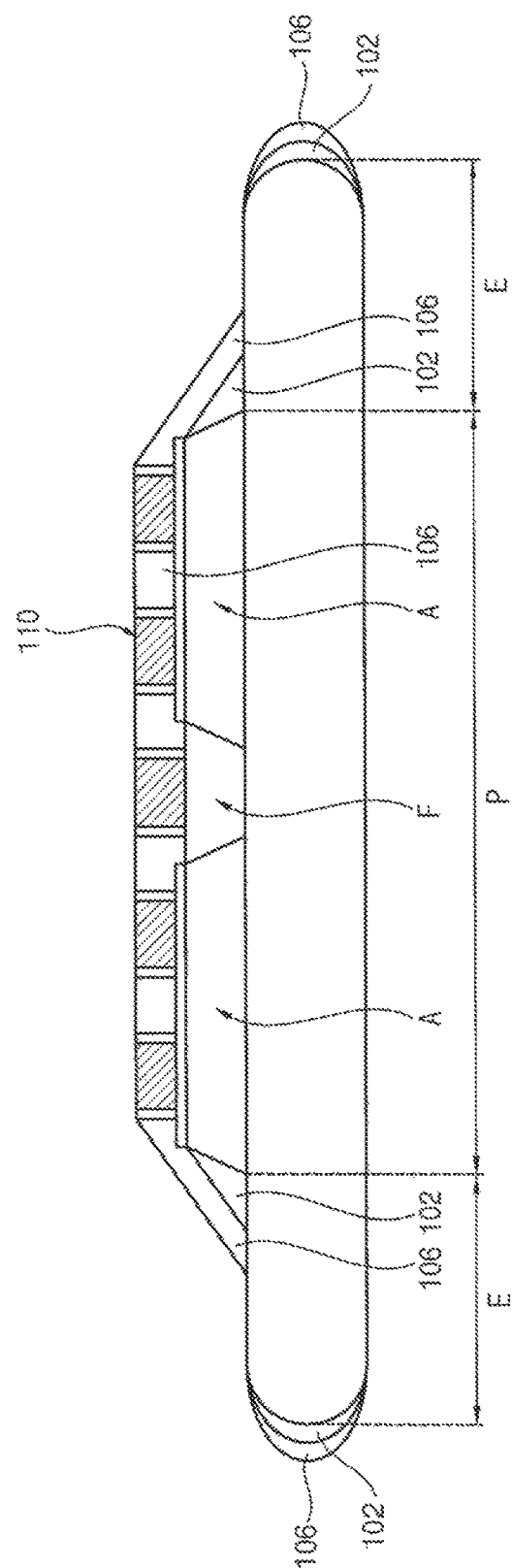

Referring to FIG. 5, the interlayer insulating layer 106a may be partially removed from the substrate 101 by a planarization process until a top surface of the dummy gate structure 110 may be exposed. The interlayer insulating layer 106a may remain only in the gap space between the neighboring dummy gate structures 110, to thereby form the interlayer insulating layer pattern 106 through which the dummy gate structures 110 may be exposed.

For example, an upper portion of the interlayer insulating layer 106a may be planarized by a chemical mechanical polishing (CMP) process until the top surface of the dummy gate structure 110 is exposed. In some embodiments, an upper surface of the interlayer insulating layer pattern 106 may be coplanar with the top surface of the dummy gate structure 110.

Particularly, the device isolation layer 102 and the interlayer insulating layer 106a may be removed from the edge area E of the substrate 101 in the CMP process, so that the surface of the substrate 101 may be exposed at the edge area E.

While the interlayer insulating layer 106a may be partially removed from the pattern area P of the substrate 101 merely until the top surface of the dummy gate structure 110 in the CMP process, the device isolation layer 102 as well as the interlayer insulating layer 106a may be removed from the edge area E of the substrate 101 in the same CMP due to a local dishing of the polishing process.

Accordingly, the surface of the substrate 101 at the edge area E and the dummy gate structure 110 may be exposed through the interlayer insulating layer 110.

Figure 6:
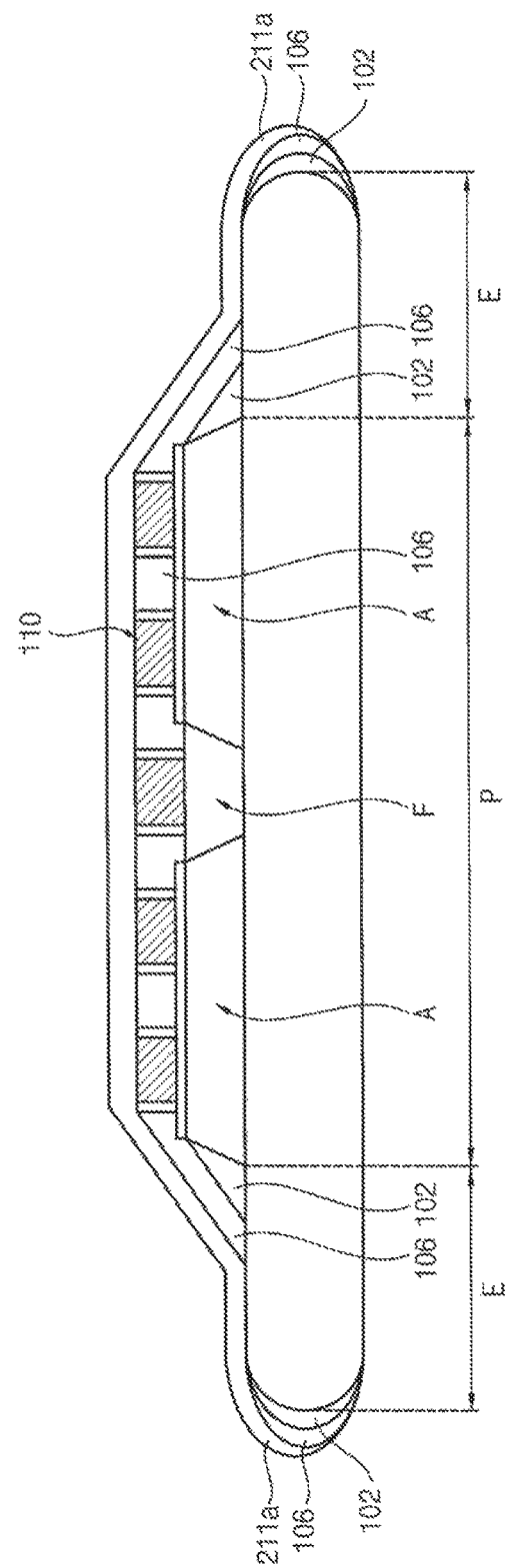

Referring to FIG. 6, a blocking layer 211a may be formed on the whole substrate 101 in such a configuration that all the interlayer insulating layer pattern 106, the dummy gate structure 110 and the edge area E may be covered with the blocking layer 211a.

For example, silicon oxide may be deposited to a uniform thickness on the whole substrate 101 including the interlayer insulating layer pattern 106 and the dummy gate structure 110 by a CVD process or an ALD process. In some embodiments, the silicon oxide layer may be uniformly formed on a whole surface of the substrate 101 along the surface profile of the dummy gate structure 110 as the blocking layer 211a.

The edge area E of the substrate 101 may also be covered with the blocking layer 211a.

Thereafter, a mask pattern 212 may be formed on the blocking layer 211a in such a way that the blocking layer 211a of the pattern area P of the substrate 101 may be exposed while the blocking layer 211a of the edge area E may still be covered with the mask pattern 212 through the example processes described with reference to FIGS. 7 and 8. In the present example embodiment, the mask pattern 212 may include a photoresist pattern. However, any other materials as well as the photoresist materials may also be utilized for the mask pattern 212 as long as the mask pattern may function as an etching mask in patterning the blocking layer 211a.

Figure 7:
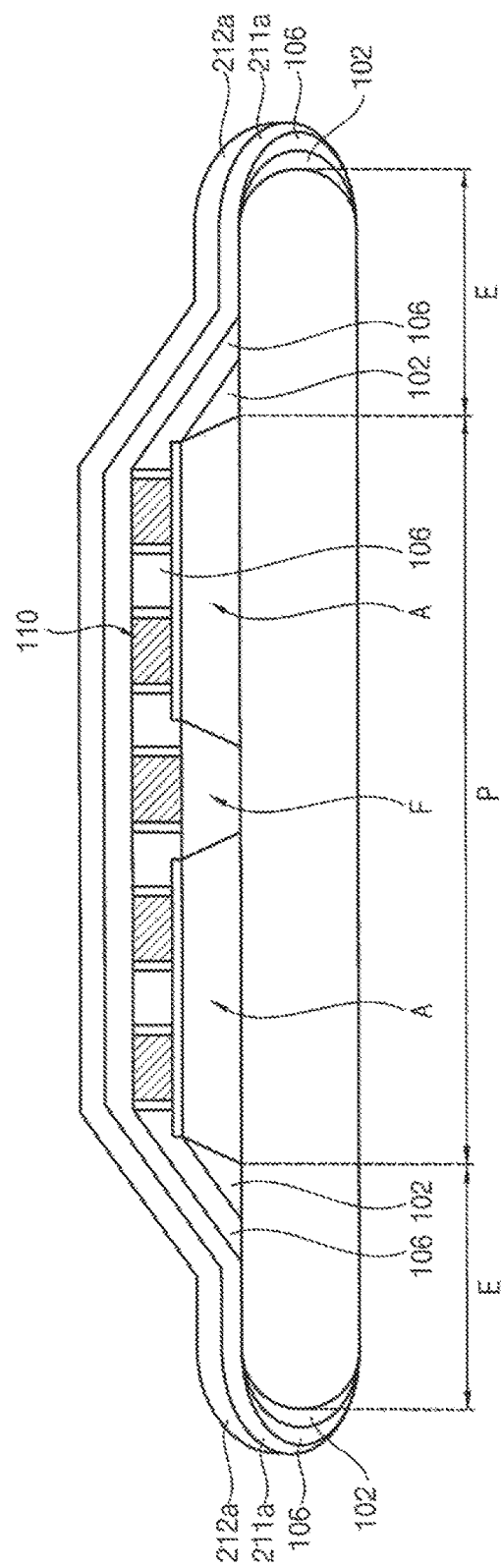

Referring to FIG. 7, a photoresist layer 212a may be formed on the blocking layer 211a.

For example, the photoresist layer 212a may be uniformly formed on the blocking layer 211a by a spin coating process.

The substrate 101 including the blocking layer 211a may be loaded onto a spin chuck in a process chamber of the spin coating process and then photoresist materials may be provided onto the substrate 101 in a liquefied solution while rotating the spin chuck at a high speed. In some embodiments, the photoresist solution may be uniformly distributed on a whole surface of the substrate 101 and the photoresist layer 212a may be uniformly formed on the substrate 101 along a surface profile of the substrate 101.

Accordingly, the edge area E of the substrate 101 may be covered with the blocking layer 211a and the photoresist layer 212a.

In the present example embodiment, the photoresist layer 212a may function as an etching mask for patterning the blocking layer 211a and may not function as a mask pattern for forming a pattern in the pattern area P. For that reason, the thickness deviation of the photoresist layer 212a between the pattern area P and the edge area E, which may be caused by a stress difference between a central portion and a peripheral portion of the substrate 101 in the spin coating process, may have no effect on pattern defects in the pattern area P. In addition, since the photoresist pattern 212 may be removed from the substrate 101 prior to an etching process for removing the dummy gate line 110, there may be little possibility that the photoresist pattern 212 at the edge area E may function as a defect source in a subsequent process for forming the metal gate structure 310.

Particularly, the photoresist layer 212a may be partially removed from the substrate 101 by a wafer edge exposure (WEE) process as will be described in detail hereinafter. Since the photoresist layer 212a may need to be removed from the pattern area P, not from the edge area E of the substrate 101 by the WEE process in the conventional WEE apparatus, the photoresist layer 212a may comprise negative type photoresist materials.

Therefore, the photoresist pattern 212 through which the blocking layer 211a of the pattern area P may be exposed may be formed by using the conventional WEE apparatus without any modifications for performing the present method of manufacturing semiconductor devices.

Referring to FIG. 8, the photoresist layer 212a may be formed into a photoresist pattern 212 through which the blocking layer 211a of the pattern area P may be exposed by an edge bead process, the WEE process and a developing process.

When the photoresist solution is provided on the substrate 101, photoresist materials may move outwards to the peripheral portion of the substrate 101 and may stack on the edge area E and a rear surface of the substrate 101 due to a viscosity of the photoresist material and a surface tension of the substrate 101, thereby forming edge beads at the peripheral portion of the substrate 101.

Conventionally, the edge beads may cause various defects in manufacturing semiconductor devices such as an apparatus contamination, a flatness reduction of a wafer and a focusing deviation in an exposure process. Particularly, rear beads that may be stacked on the rear surface of the substrate may function as a defect source to a subsequent wafer that may be loaded to the same process chamber.

However, the photoresist layer 212a may function as an etching mask for patterning the blocking layer 211a and may not function as a mask pattern in a photoresist process for forming a pattern in the pattern area P. In addition, the photoresist pattern 212 may be removed from the substrate 101 before the dummy gate line 110 is replaced with the metal gate, and the photoresist pattern 212 at the edge area E may not function as the defect source in a subsequent process in the same process chamber. For example, the wafer flatness and the focusing deviation in the exposure process may not be deteriorated by the photoresist pattern 212 on the edge area E.

In contrast with the conventional manufacturing process in which the edge beads require removing from the peripheral portion of the wafer and exposing the wafer surface at the peripheral portion, the substrate surface of the edge area E may be covered or protected in the replacement gate metal (RGM) process for preventing the defect sources in the edge area E. For example, the edge area E of the substrate 101 may be sufficiently covered or protected by the blocking pattern 211 and/or the photoresist pattern 212.

For those reasons, the edge bead removal (EBR) process may be performed just to the rear surface and the side surface of the substrate 101 except for the active surface of the edge area E of the substrate 101.

Figure 15:
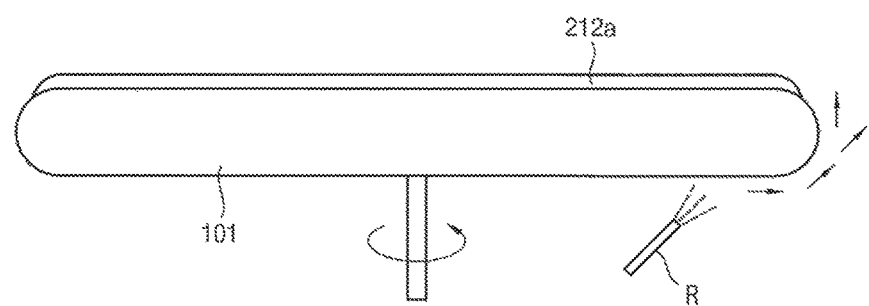
FIG. 15 is a view illustrating an EBR process for removing the edge beads from the substrate in accordance with an example embodiment.

FIG. 15 is a view illustrating an EBR process for removing the edge beads from the substrate in accordance with an example embodiment.

Referring to FIG. 15, the EBR process of the present example embodiment may be performed through at least one of a back rinsing process and a bevel rinsing process, rather than a front rinsing process. A cleaning solution may be injected to the rear surface of the edge area E of the substrate 101 in the back rinsing process and the cleaning solution may be injected to a bevel area of the substrate 101 including the side surface of the substrate 101 in the bevel rinsing process. The cleaning solution may be injected to a front surface, i.e., an active face, of the substrate 101 at the edge area E.

In contrast, the conventional EBR process may be performed through the front rinsing process, rather than the back rinsing process and the bevel rinsing process. In some embodiments, the photoresist layer 212a may still remain on the edge area E of the substrate 101 when completing the EBR process.

When the edge beads are sufficiently removed from the rear and side surfaces of the peripheral portion of the substrate 101, the wafer edge exposure (WEE) process may be performed to the substrate 101 and the peripheral portion of the substrate 101 may be exposed to light. For example, the edge area E may be exposed to the light while the pattern area P may be protected from the light. Since the photoresist layer 212a may comprise negative-type photoresist materials, the photoresist layer 212a on the edge area E may not be dissolved by the light and the photoresist layer 212a on the pattern area P may be dissolved by the light.

The dissolved photoresist layer 212a may be removed from the pattern area P by the developing process and the blocking layer 211a of the pattern area P may be exposed while the edge area E may be still covered with the photoresist layer 212a, thereby forming the photoresist pattern 212 on the blocking layer 211a.

Figure 9:
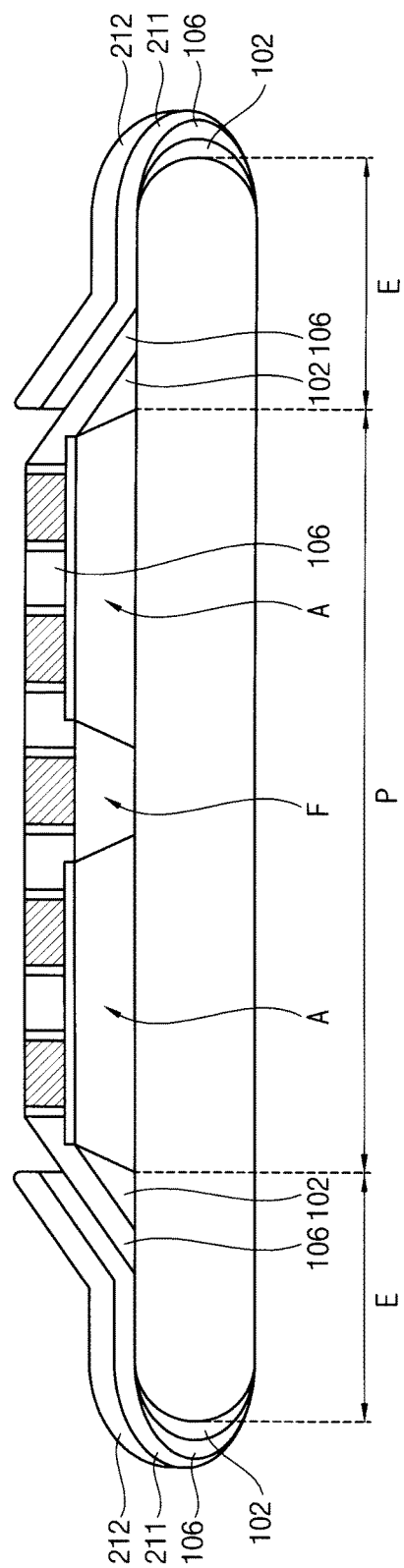

Referring to FIG. 9, the blocking layer 211a may be partially removed from the substrate 101, thereby forming a blocking pattern 211 through which the dummy gate lines 110 on the pattern area P may be exposed. In some embodiments, the edge area E may still be covered with the blocking pattern 211.

For example, the blocking layer 211a may be removed from the pattern area P by a first dry etching process using the mask pattern 212 as an etching mask. In the present example embodiment, the blocking layer 211a may comprise silicon oxide and the mask pattern 212 may comprise photoresist material, and the blocking layer 211a may be removed by the first dry etching process, such as a plasma etching process in which the blocking layer 211a may have an etching rate greater than the mask pattern 212.

In such a case, a native oxide layer (not shown) may be removed from the dummy gate line 110 together with the blocking layer 211a by the same first dry etching process.

In the present example embodiment, since the dummy gate line 104 may comprise polysilicon, the native oxide layer may be naturally formed on the dummy gate line 104 when the blocking layer 211a is removed. However, since the blocking layer 211a and the native oxide layer may comprise silicon oxide, both of the blocking layer 211a and the native oxide layer may be removed by the dry etching process.

Therefore, the blocking pattern 211 may be formed on the substrate 101 in such a way that the dummy gate line 110 on the pattern area P may be exposed through the blocking pattern 211 and the edge area E may still be covered with the blocking pattern 211.

Figure 10:
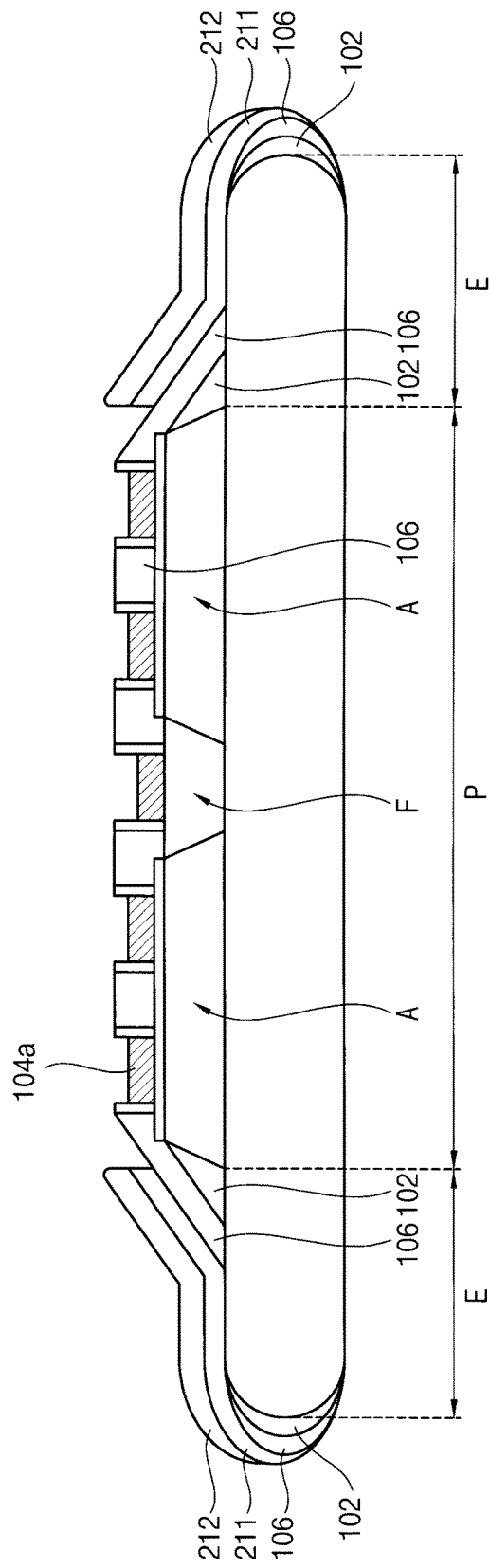

Referring to FIG. 10, a second dry etching process may be further performed consecutively to the first dry etching process, and an upper portion of the dummy gate line 104 may be removed from the pattern area P of the substrate 101.

For example, when the first dry etching process is completed, the etching conditions of the first dry etching process may be changed for etching the dummy gate line 104, to thereby prepare the second dry etching process. Then, the second dry etching process may be consecutively performed to the same pattern area P of the substrate 101, and the upper portion of the dummy gate line 104 may be removed from the pattern area P. In some embodiments, the dummy gate line 104 may be formed into a reduced dummy gate line 104a having a reduced height.

Since the gate spacer 105 may comprise silicon nitride and the interlayer insulating layer pattern 106 may comprise silicon oxide, the dummy gate line 104 may have an etching rate greater than the gate spacer 105 and the interlayer insulating layer pattern 106 in the second dry etching process.

The first and the second dry etching processes may be consecutively performed to the same pattern area P of the substrate 101 without any substantial time interval.

Then, the reduced dummy gate line 104a may be sufficiently removed from the pattern area P of the substrate 101, thereby forming a gate hole H in the pattern area P.

Figure 11:
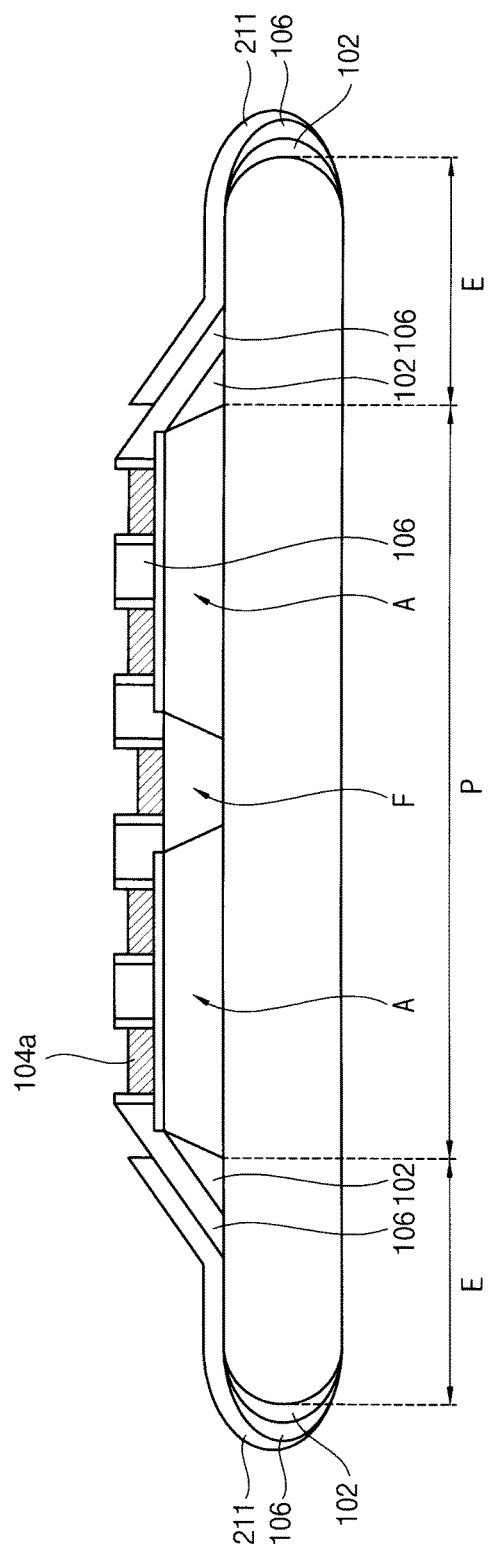

Referring to FIG. 11, the mask pattern 212 may be removed from the blocking pattern 211. In the present example embodiment, the mask pattern 212 may comprise photoresist materials and may be removed by an ashing process.

Although the mask pattern 212 may be removed from the blocking pattern 211, the edge area E may still be covered with the blocking pattern 211. In some embodiments, the substrate surface of the edge area E may be sufficiently prevented from damages in a subsequent process.

Figure 12:
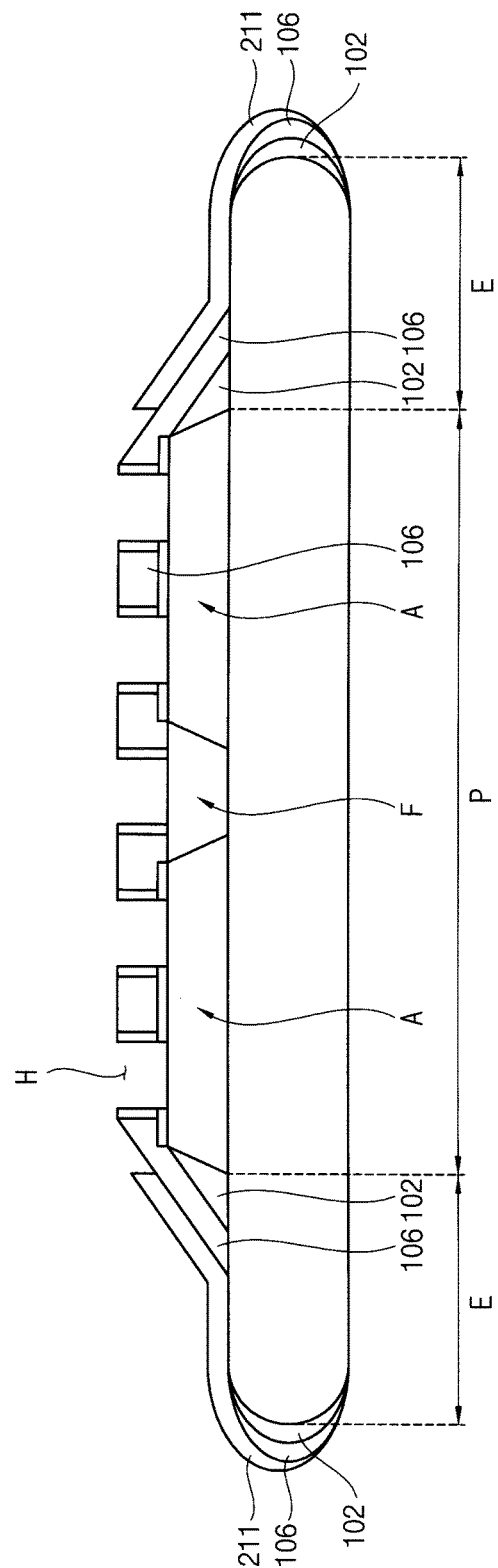

Referring to FIG. 12, the reduced dummy gate line 104a may be fully removed from the pattern area P of the substrate 101 by a wet etching process.

The dummy gate line 104 may be partially removed by the second dry etching process and then the reduced dummy gate line 104a may be fully removed from the pattern area P by the wet etching process, thereby forming the gate hole H that may be defined by the gate spacer 105 and the capping layer 103. In such a case, the capping layer 103 may function as an etch stop layer to the wet etching process.

For example, the wet etching process may be performed through 2 steps: a first wet etching process for removing a native oxide layer on the reduced dummy gate line 104a and a second wet etching process for removing polysilicon on the capping layer 103.

For example, the first wet etching process may be performed by using an aqueous hydrogen fluoride (HF) solution as an etchant and the second wet etching process may be performed by using an aqueous ammonia (NH4) solution.

Since the edge area E of the substrate 101 may be covered with the blocking pattern 211 in the wet etching process, no damage may be cased to the edge area E in the wet etching process.

The capping layer 103 may be selectively removed from the pattern area P of the substrate 101 before forming the metal gate structure 310 in the gate hole H.

When filling up the gate hole H with the metal gate electrode, the capping layer 103 may function as a gate insulation layer as long as the capping layer 103 may have sufficient dielectric characteristics between the substrate 101 and the metal gate thereon. In such a case, the capping layer 103 need not be removed from the pattern area P.

However, when the electrical resistance of the metal gate in the gate hole H is insufficient or relatively low, it may be helpful for the gate insulation layer under the metal gate to have high dielectric characteristics. In such a case, the capping layer 103 may be removed from the substrate 101 and a high dielectric layer such as a high-k layer may be formed on the bottom of the gate hole H as the gate insulation layer between the metal gate and the substrate 101.

The capping layer 103 may be removed from the substrate 101 by a dry etching process or a wet etching process. Otherwise, an additional gate insulation layer (not shown) may be further formed on the capping layer 103.

Thereafter, a metal gate structure 310 may be formed in the gate hole H of the pattern area P of the substrate 101. In the present example embodiment, the capping layer 103 may be replaced with the gate insulation layer 301. However, the capping layer 103 may also be used as the gate insulation layer 301, as described in detail above.

Figure 13:
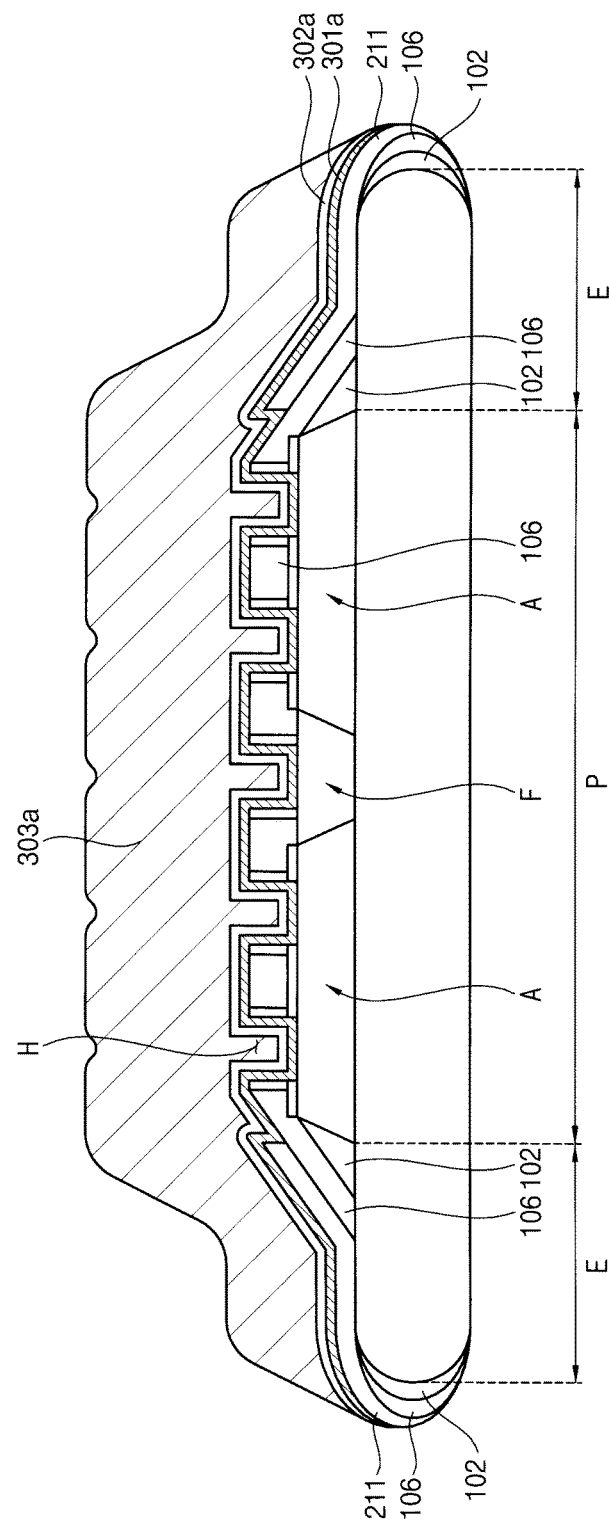
Figure 14:
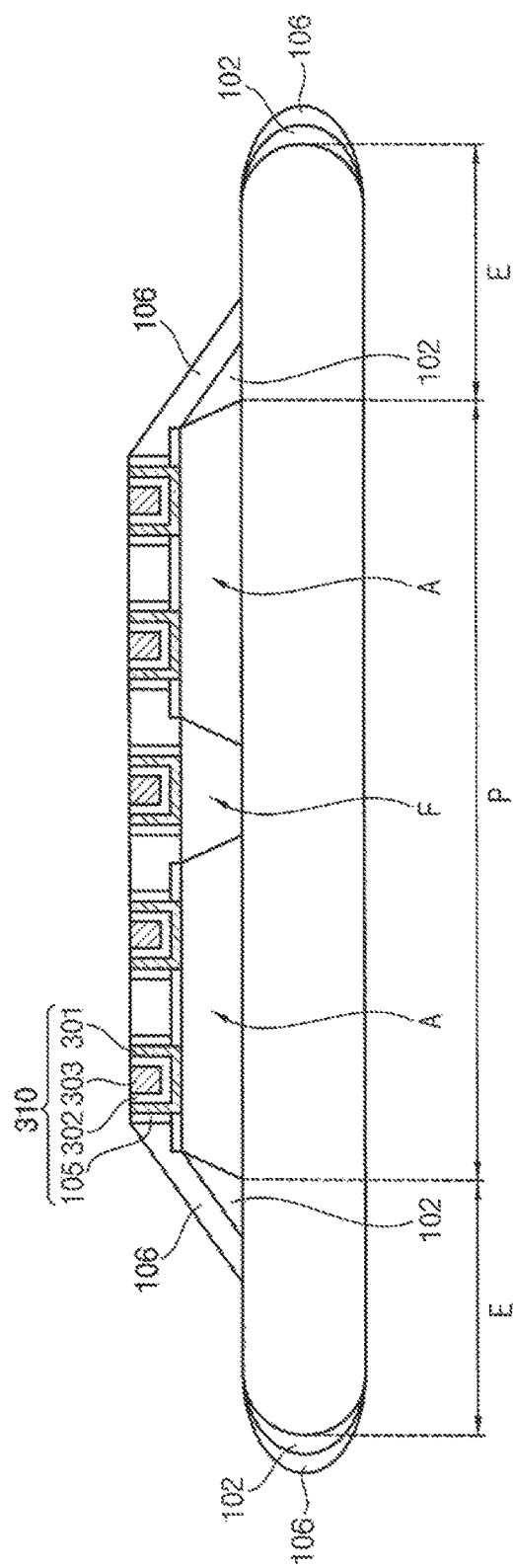

Referring to FIGS. 13 and 14, a gate insulation layer 301a may be formed on the interlayer insulating layer pattern 106 and on the bottom surface and sidewall of the gate hole H.

For example, high-k materials having a high dielectric constant may be deposited by an atomic layer deposition (ALD) process and the high-k material layer may be provided as the gate insulation layer 301a. Examples of the high-k materials may include hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, iridium oxide, aluminum oxide, lead scandium tantalum oxide, lead zinc niobate, etc. These may be used alone or in combinations thereof. The gate insulation layer 301a may be formed to a thickness less than or equal to about 4 nm, and more particularly, to about 0.5 nm to about 2 nm.

Thereafter, a barrier metal layer 302a may be formed on the insulation layer 301a along the surface profile of the gate hole H.

The barrier metal layer 302a may prevent the metal material of the metal gate from diffusing into the interlayer insulating layer pattern 106 and the substrate 101 and may improve adhesiveness to the silicon substrate 101.

For example, the barrier metal layer 302a may include a nitride of a conductive metal having a low resistance that may be formed by a CVD or an ALD process. In the present example embodiment, the barrier metal layer 302a may comprise one of tungsten nitride (WN), titanium nitride (TiN) and tantalum nitride (TaN).

Then, a gate metal layer 303a may be formed on the barrier metal layer 302a to a sufficient thickness to fill up the gate hole H.

For example, conductive metals having low electrical resistance may be deposited to the barrier metal layer 302a by a CVD process to a sufficient thickness to fill up the gate hole H, thereby forming the gate metal layer 303a. Examples of the conductive metals for the gate metal layer 303a may include tungsten (W), titanium (Ti), aluminum (Al), tantalum (Ta), cobalt (Co), copper (Cu), nickel (Ni), etc. These may be used alone or in combinations thereof.

Thereafter, the gate metal layer 303a, the barrier metal layer 302a and the gate insulation layer 301a may be partially removed from the substrate 101, forming a metal gate electrode 303, a barrier metal pattern 302 and a gate insulation pattern 301 in the gate hole H.

For example, the gate metal layer 303a, the barrier metal layer 302a and the insulation layer 301a may be partially removed from the substrate 101 by a planarization process, such as a CMP process, until a top surface of the interlayer insulating layer pattern 106 is exposed, so that the gate metal layer 303a, the barrier metal layer 302a and the insulation layer 301a remain just in each of the gate holes H. In some embodiments, the gate metal layer 303a, the barrier metal layer 302a and the insulation layer 301a may be separated at every gate hole H and may be formed into the metal gate electrode 303, the barrier metal pattern 302 and the gate insulation pattern 301 in each gate hole H.

The metal gate electrode 303, the barrier metal pattern 302 and the gate insulation pattern 301 may extend in a line on the substrate 101 to thereby form a gate line 309. The gate line 309 and the gate spacer 105 covering both sidewalls of the gate line 309 may be formed into the metal gate structure 310 at the pattern area P of the substrate 101.

The edge area E of the substrate 101 may be covered with the blocking pattern 211 in the etching process for removing the dummy gate line 110 and in the deposition process for forming the gate insulation layer 301a, the barrier metal layer 302a and the gate metal layer 303a. Then, the blocking pattern 211 may be removed from the edge area E of substrate 101 by the planarization process for forming the metal gate structure 310.

For example, the blocking layer 211 may be removed from the substrate 101 together with the gate insulation layer 301a, the barrier metal layer 302a and the gate metal layer 303a by the planarization process.

Therefore, the edge area E may be sufficiently protected from the etching process and the deposition process, and no damage may be caused to the edge area E in the etching process and the deposition process. Accordingly, the metal gate structure 310 may be formed on the pattern area p without any defect sources at the edge area E of the substrate 101.

Thereafter, additional interlayer insulating layer patterns, charge storage structures and wiring structures may be further formed on the substrate 101 for manufacturing the semiconductor device.

The metal gate structures 310 are disclosed as illustrations of example gate structure of semiconductor devices, and various modifications of the metal gate structure 310 may be allowable in view of electrical characteristics and device requirements of the semiconductor device. For example, some of the metal gate structures 310 may be formed into p-type gate electrodes and the others of the metal gate structures 310 may be formed into n-type gate electrodes, thereby manufacturing complementary metal oxide semiconductor (CMOS) devices.

According to the example embodiments of the method of semiconductor devices, the blocking layer may be formed on a whole surface along the surface profile of the dummy gate line on the pattern area of the substrate and be formed into the blocking pattern through which the pattern area of the substrate is exposed and with which the edge area of the substrate is covered. Therefore, the edge area of the substrate may be sufficiently protected from the etching process for removing the dummy gate line from the pattern area and the deposition process for forming the metal gate structure, and no damage may be caused to the edge area of the substrate in the etching process and the deposition process.

Particularly, the edge trench may be sufficiently prevented at the edge area of the substrate, and as a result, there is no possibility that the conductive materials of the gate metal layer may be deposited into the edge trench in forming the metal gate structure, thereby preventing the defect sourced at the edge area of the substrate.

In addition, since the negative type photoresist pattern may be used as a mask pattern for forming the blocking pattern, the conventional wafer edge exposure (WEE) apparatus may be used without any modifications when forming the mask pattern for the blocking pattern. Particularly, the edge bead removal (EBR) process may be performed just merely at the bevel area of the substrate except the substrate surface of the edge area in the conventional WEE process, so that the edge area may be still covered with the mask pattern.

Accordingly, the edge area of the substrate may be sufficiently protected from the replacement gate metal (RGM) process by the blocking pattern and no damage, such as the edge trench, may be caused to the edge area of the substrate, thereby preventing the defect source such as the conductive bulk at the edge area of the substrate.

While the present example embodiments discloses that the edge area of the substrate is protected by the blocking pattern in the RGM process for replacing the dummy gate line with the metal gate line, the blocking pattern would also be applied to various processes for forming any other micro devices as long as the edge area of the substrate needs to be protected in an etching process. For example, when the edge area of a glass substrate for flat display devices needs to be protected in a process for forming driving gate structures for the flat display devices, the blocking pattern may also be formed on the edge area of the glass substrate.

The foregoing is illustrative of example embodiments and is not to be construed as limiting thereof. Although a few example embodiments have been described, those skilled in the art will readily appreciate that many modifications are possible in the example embodiments without materially departing from the teachings and advantages. Accordingly, all such modifications are intended to be included within the scope of the present disclosed embodiments. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A method of manufacturing a semiconductor device, comprising:
    providing a substrate including a pattern area and an edge area to which a wafer edge exposure process is performed;
    forming a plurality of first gate structures on the pattern area, the plurality of first gate structures being separated from one another by an insulating layer pattern formed on the pattern area;
    forming a blocking pattern on the substrate to cover the edge area; and
    replacing the plurality of first gate structures with second gate structures.

2. The method of claim 1, wherein the pattern area includes at least an active fin structure that is an active region protruded from a surface of the substrate and defined by a device isolation layer, and
    wherein the plurality of first gate structures are arranged on the active fin structure.

3. The method of claim 1, wherein replacing the plurality of first gate structures with the second gate structures includes:
    removing the plurality of first gate structures by an etching process having an etching selectivity with respect to the blocking pattern and the insulating layer pattern, thereby forming a plurality of openings on the pattern area;
    forming preliminary second gate structures on the insulating layer pattern to fill the plurality of openings; and
    planarizing the preliminary second gate structures such that the preliminary second gate structures remain in the openings.

4. The method of claim 3, wherein the blocking pattern is removed from the substrate with the preliminary second gate structures such that the substrate in the edge area is exposed when the second gate structures are formed on the substrate.

5. A method of manufacturing a semiconductor device, comprising:
    providing a substrate including a pattern area and an edge area to which a wafer edge exposure process is performed;

forming a dummy gate structure on the pattern area;
forming an insulating layer pattern to expose an upper surface of the dummy gate structure in the pattern area and to expose the substrate in the edge area;
forming a blocking pattern on the substrate to cover the substrate in the edge area and to expose the pattern area;
forming a gate hole in the pattern area in correspondence to the dummy gate structure; and
forming a metal gate structure in the gate hole.

6. The method of claim 5, wherein forming the blocking pattern includes:
forming a blocking layer on the substrate to cover the dummy gate structure, the insulating layer pattern and substrate in the edge area;
forming a mask pattern on the blocking layer, the mask pattern exposing the pattern area and covering the edge area; and
removing the blocking layer in the pattern area.

7. The method of claim 6, wherein forming the mask pattern includes:
forming a photoresist layer on the blocking layer, the photoresist layer including a negative type photoresist;
performing the wafer edge exposure process on the photoresist layer, thereby exposing the photoresist layer on the edge area to a light; and
developing the photoresist layer to remove the photoresist layer in the pattern area while retaining the photoresist layer in the edge area, thereby forming a photoresist pattern as the mask pattern such that the blocking layer in the pattern area is exposed and the blocking layer in the edge area is covered with the photoresist pattern.

8. The method of claim 7, after forming the photoresist layer, further comprising performing an edge bead removal (EBR) process, thereby removing residuals of the photoresist layer from at least one of a rear surface and a side surface of the substrate.

9. The method of claim 6, wherein removing the blocking layer is performed by a dry etching process using the mask pattern as an etching mask.

10. The method of claim 9, wherein the blocking layer includes silicon oxide and the dummy gate structure includes polysilicon such that the blocking layer is removed in the pattern area by a first dry etching process and the dummy gate structure is removed in the pattern area by a second dry etching process that is performed consecutively to the first dry etching process.

11. The method of claim 5, wherein forming the dummy gate structure includes:
forming a capping layer on the pattern area of the substrate;
forming a plurality of dummy gate lines on the capping layer, the plurality of dummy gate lines linearly extending in a direction and being spaced apart by a uniform gap distance; and
forming gate spacers on each side portion of one of the plurality of dummy gate lines.

12. The method of claim 11, wherein forming the insulating layer pattern includes:
forming an insulating layer on the substrate to cover the dummy gate structure such that the pattern area and the edge area are covered with the insulating layer; and
removing the insulating layer on the substrate such that the insulating layer remains in a gap space between the gate spacers neighboring with each other and the dummy gate structure and the substrate in the edge area is exposed.

13. The method of claim 11, wherein forming the gate hole is performed by a wet etching process in which the gate spacers, the insulating layer pattern and the blocking pattern have a higher etching rate than the dummy gate structure.

14. The method of claim 11, wherein forming the metal gate structure in the gate hole includes:
forming a gate insulation layer on a bottom and a sidewall of the gate hole and on a top surface of the blocking pattern and the insulating layer pattern;
forming a gate metal layer on the gate insulation layer to fill the gate hole; and
planarizing the gate metal layer and the gate insulation layer such that the gate insulation layer and the gate metal layer remain in the gate hole and the substrate in the edge area is exposed.

15. The method of claim 14, wherein the gate insulation layer includes a high-k material and the gate metal layer includes one of tungsten (W) and aluminum (Al).

16. A method of manufacturing a semiconductor device, comprising:
providing a substrate including a pattern area and an edge area to which a wafer edge exposure process is performed;
forming a plurality of gate structures on the pattern area;
forming an insulating layer pattern to separate the plurality of gate structures in the pattern area and to expose the edge area; and
forming a blocking pattern on the substrate to contact the substrate in the edge area and to expose the insulating layer pattern on the pattern area.

17. The method of claim 16, further comprising replacing the plurality of gate structures with other gate structures, wherein replacing the plurality of gate structures with the other gate structures includes:
removing the plurality of gate structures by an etching process having an etching selectivity with respect to the blocking pattern and the insulating layer pattern, thereby forming a plurality of openings on the pattern area;
forming preliminary gate structures on the insulating layer pattern to fill the plurality of openings; and
planarizing the preliminary gate structures such that the preliminary gate structures remain in the openings.

18. The method of claim 17, wherein the blocking pattern is removed from the substrate with the preliminary gate structures such that the substrate in the edge area is exposed when the other gate structures are formed on the substrate.

19. The method of claim 16, wherein forming the blocking pattern includes:
forming a blocking layer on the substrate to cover the plurality of gate structures, the insulating layer pattern and the substrate in the edge area;
forming a mask pattern on the blocking layer, the mask pattern exposing the pattern area and covering the edge area; and
removing the blocking layer in the pattern area.

20. The method of claim 19, wherein forming the mask pattern includes:
forming a photoresist layer on the blocking layer, the photoresist layer including a negative type photoresist;
performing the wafer edge exposure process on the photoresist layer, thereby exposing the photoresist layer on the edge area to a light; and
developing the photoresist layer to remove the photoresist layer in the pattern area while retaining the photoresist layer in the edge area, thereby forming a photoresist pattern as the mask pattern such that the blocking layer in the pattern area is exposed and the blocking layer in the edge area is covered with the photoresist pattern.

* * * * *